United States Patent [19]

Meuleman et al.

[11] 4,450,564
[45] May 22, 1984

[54] APPARATUS FOR MODULATING THE OUTPUT SIGNAL OF A CONVERTER

[75] Inventors: Lambertus J. Meuleman; Abram van de Grijp; Engel Roza, all of Eindhoven, Netherlands

[73] Assignee: U.S. Philips Corporation, New York, N.Y.

[21] Appl. No.: 299,436

[22] Filed: Sep. 4, 1981

[30] Foreign Application Priority Data

Sep. 15, 1980 [NL] Netherlands ................ 8005153

[51] Int. Cl.³ .................................................. H01S 3/10
[52] U.S. Cl. ...................................... 372/26; 372/29; 372/25
[58] Field of Search ............... 372/26, 29, 33, 30, 372/38, 46, 25

[56] References Cited

U.S. PATENT DOCUMENTS

| | | | |
|---|---|---|---|
| 3,258,596 | 6/1966 | Green | 372/30 |
| 4,305,047 | 12/1981 | Chapman et al. | 372/46 |
| 4,319,203 | 3/1982 | Brosio et al. | 372/30 |
| 4,347,610 | 8/1982 | Meuleman | 372/29 |

FOREIGN PATENT DOCUMENTS

2045516 10/1980 United Kingdom ............. 372/29

*Primary Examiner*—James W. Davie
*Assistant Examiner*—Leon Scott, Jr.
*Attorney, Agent, or Firm*—Robert T. Mayer; Bernard Franzblau

[57] ABSTRACT

Apparatus for modulating the output signal of a converter for converting electric signals into other signals, for example optical signals. An analog signal is applied to a subtraction device (6) the output signal of which controls a limiter (7). The binary output signal thereof controls the semiconductor laser diode (1) which is coupled to a photo-sensitive detector (3) for producing a feedback signal. After being amplified in a broad-band amplifier (9) and integrated in an integrator (13), this feedback signal is applied to the subtraction device (6), so that the feedback signal is subtracted from the analog signal. Variations in the optical output signal due to a non-linear conversion characteristic of the laser diode (1) and due to an optical retroaction of the fibre (2) on the laser diode, as well as output noise and signal-dependent amplitude variations, are reduced by the negative feedback.

11 Claims, 3 Drawing Figures

APPARATUS FOR MODULATING THE OUTPUT SIGNAL OF A CONVERTER

This invention relates to an arrangment for modulating the output signal of a converter which converts electric signals into other signals, for example, of an electro-optical converter, such as a semiconductor laser diode with an analog input signal. The arrangement comprises a feedback loop which includes the converter and means for demodulating a portion of the converter output signal for supplying a feedback signal, and means for applying the feedback signal and the analog input signal to a subtractor device in which the feedback signal is subtracted from the analog input signal.

Such an arrangement is disclosed, inter alia, in the Japanese Kokai No. 51-137303. The optical feedback proposed therein is of necessity limited to a small frequency bandwidth and/or a low loop gain in view of the risk of instability of the feedback loop due to the delays and phase shifts occurring therein.

The invention has for an object to realize a linear modulation of the converter output signal as well as a high signal-to-noise ratio of the modulated output signal.

According to the invention, this object is accomplished in that the output signal of the subtraction device controls a limiter, the limiter producing a binary output signal for controlling the said converter, all this in a manner such that a self-excited oscillation is obtained with an analog signal dependent modulation in the feedback loop of the pulse width and/or pulse density of the pulse-shaped output signal of the limiter.

In this way the non-linear distortion products of the modulating analog signal, which are present in the modulated output signal and are the result of a non-linear conversion characteristics of the converter and/or the non-linearity in the switching delay of the converter, and the noise and the signal-dependent pulse amplitude variation produced at the output of the converter, are compensated to a considerable degree by an instantaneous adaptation of the pulse width/pulse period ratio of the limiter output signal.

It should be noted that a modulation system is known which is designated rectangular wave modulation, in, for example, Electronics Letters, January 1966, Volume 2, No. 1, pages 7-9. The information signal is there applied to a difference circuit the output signal of which controls a limiter. Means are provided for applying a portion of the limiter output signal to the difference producer, all this in such a manner that a self-excited oscillation is obtained with an information signal-dependent modulation of the pulse density and the pulse width of the pulse-shaped output signal of the limiter.

When this known arrangement is used as a control device for an electro-optical converter, the variations in the modulated optical output signal as a result of the switching delay of the converter and the signal-dependent amplitude variations of the converter output signal and also the output noise are however not reduced.

In addition, it is known per se from Proceedings, Fourth ECOC, Genova 1978, pages 656–663 to modulate the current through the semiconductor laser diode by a combination of pulse density modulation and pulse width modulation for use in a transmission system in which substantially only the base band of the optical signal is transmitted.

The invention will now be further explained with reference to the accompanying drawings in which.

Figure 1:
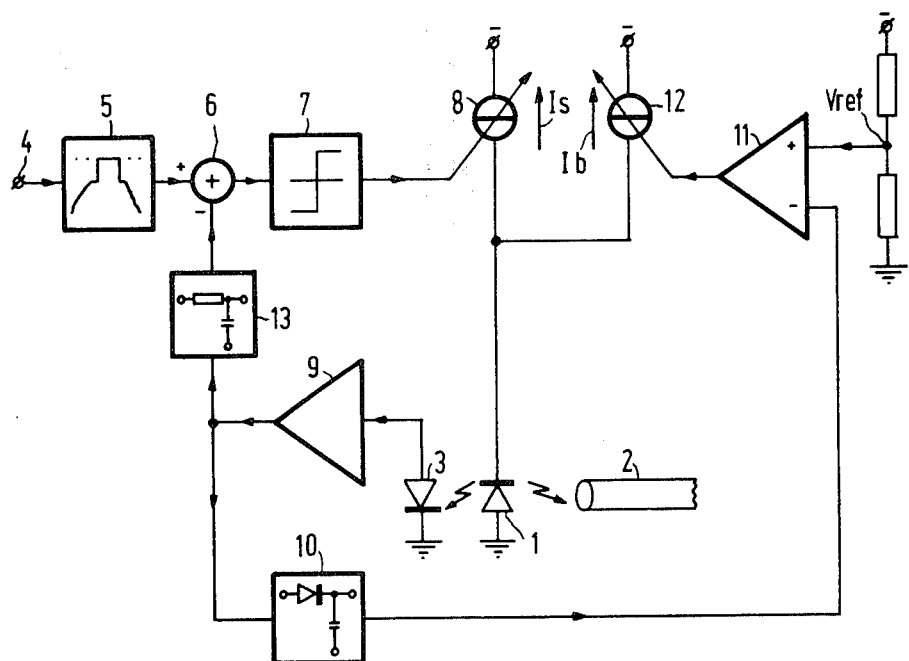
FIG. 1 shows a block schematic circuit diagram of an arrangement of the invention.

The modulation arrangement of FIG. 1 comprises a semiconductor diode laser 1, which is coupled to an optical fibre 2 and a photo-sensitive detector 3.

An analog signal, which is in this case, for example, a television video signal, is applied to a signal input 4. This signal is clamped in a clamping circuit 5 onto a fixed synchronizing pulse level. The clamping circuits may comprise, in known manner, a capacitor connected in series with the parallel circuit of a resistor and a diode between a pair of input terminals, the output being derived from across the parallel circuit. The output signal of the clamping circuit 5 is applied to a subtraction device 6, in which a negative feedback signal is subtracted from the video signal. The output signal of the subtraction device 6 controls a symmetrical limiter 7, which produces a binary output signal the value of which depends on the polarity of the input signal with respect to a discrimination level.

The binary output signal of the limiter 7 controls an adjustable current source 8 for the signal current Is, which is applied to the semiconductor laser diode 1.

The photo-sensitive diode 3 is connected to the input of a broadband amplifier 9 the output of which is connected to a peak value detector 10. The output signal of the detector is a measure of the optical peak power of the laser diode 1. This output signal is applied to the inverting input of a difference voltage amplifier 11. A reference voltage Vref which is a measure of the desired optical peak power is applied to the non-inverting input of this difference voltage amplifier. The output signal of amplifier 11 controls an adjustable current source 12 for the bias current Ib, which is applied to the laser diode 1. This control adjusts the optical peak power to a desired value by adjusting the bias current Ib.

The output of amplifier 9 is connected to the subtraction device 6 through an integrator 13. This closes a negative feedback loop which comprises the circuit elements 6-7-8-1-3-9-13-6.

This negative feedback loop has a large bandwidth and a high gain in order to realize a large negative feedback factor over a wide frequency range.

A replica of the analog input signal will be produced at the output of the integrator 13 and any difference from the analog input signal will effect a change in the pulse width/pulse period ratio of the pulse-shaped output signal of the limiter 7, thereby reducing the difference.

The negative feedback loop has such a bandwidth and such a high gain that self-excited oscillation is produced at a high frequency. In a practical case, for a signal frequency band up to 6 MHz, the negative feedback loop oscillated without input signal at a frequency of 25 MHz. The input signal modulates both the pulse density and the pulse width of the output signal of limiter 7. In a practical case, the pulse repetition rate varied between 15 MHz and 25 MHz. This combined modulation results in a frequency spectrum in which the basic frequency band of the analog signal has a relatively high power so that this system is very suitable for transmission over a fibre having a relatively small bandwidth, such as a "step-index" fibre.

The negative feedback of the baseband signal furnishes considerable advantages as regards the linearity of the modulation and the suppression of noise, particularly the noise produced in the optical output signal of the laser diode 1 by the optical retroaction of fibre 2 on the laser diode 1. The waveform of the optical signal will influence the signal transmission to a lesser extent as signal variations due to the waveform will be fed back and reduced by the negative feedback factor. The same applies to the so-called time-domain non-linearities, such as a varying switching delay of laser diode 1.

Figure 2:
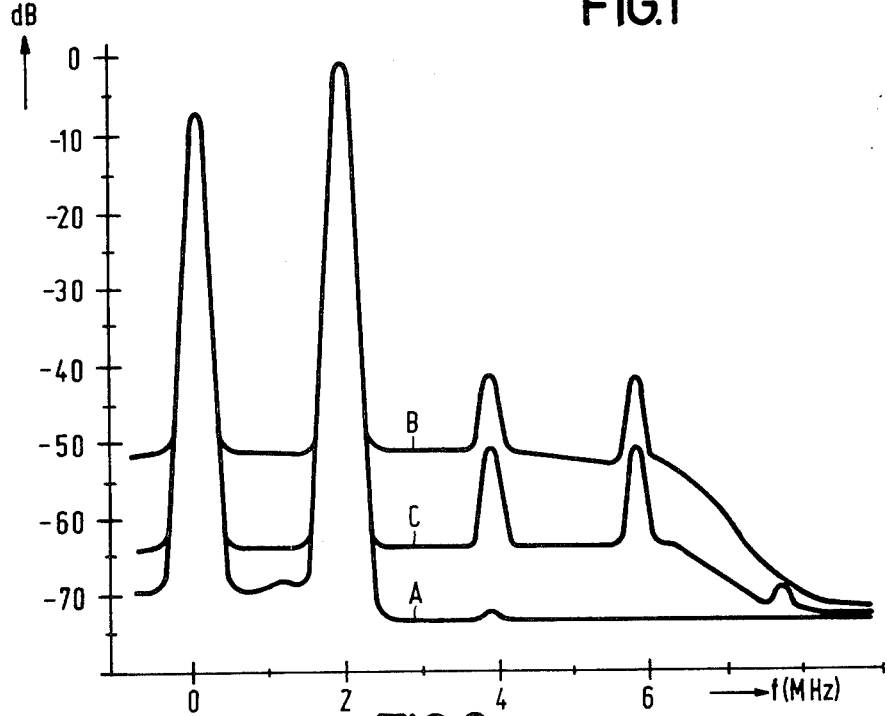
FIG. 2 shows the spectrum of a demodulated optical signal with and without the use of the invention.

By way of illustration, FIG. 2 shows some curves which are based on measurements made with a spectrum analyser when a system having direct intensity modulation (curve B) and a system having a modulation arrangement of FIG. 1 (curve C) are compared. The measurements were made on the demodulated optical signal in the case of transmission of a 2 MHz sinusoidal signal the spectrum of which is illustrated by curve A. In the system used for the above comparison, the bias current of the laser diode has been adjusted for minimum signal distortion and the signal current was adjusted for obtaining the same signal strength of the demodulated signal as in the system of the invention. In the system of the invention (curve C) the noise level is reduced by approximately 12 dB and the second and the third harmonics of the signal are each reduced by approximately 10 dB.

In certain circumstances, for example when clamping circuit 5 is overdriven by the input signal, it may happen that limiter 7 remains in the position in which the value of the signal current Is is low (zero). By increasing the value of the bias current Ib, the control loop which comprises peak detector 10 and amplifier 11 will try to keep the optical peak power constant. If thereafter the self-excited oscillation of the feedback loop starts then the bias current Ib is adjusted to a value which is much too high and the laser diode 1 must handle too high a current.

Figure 3:
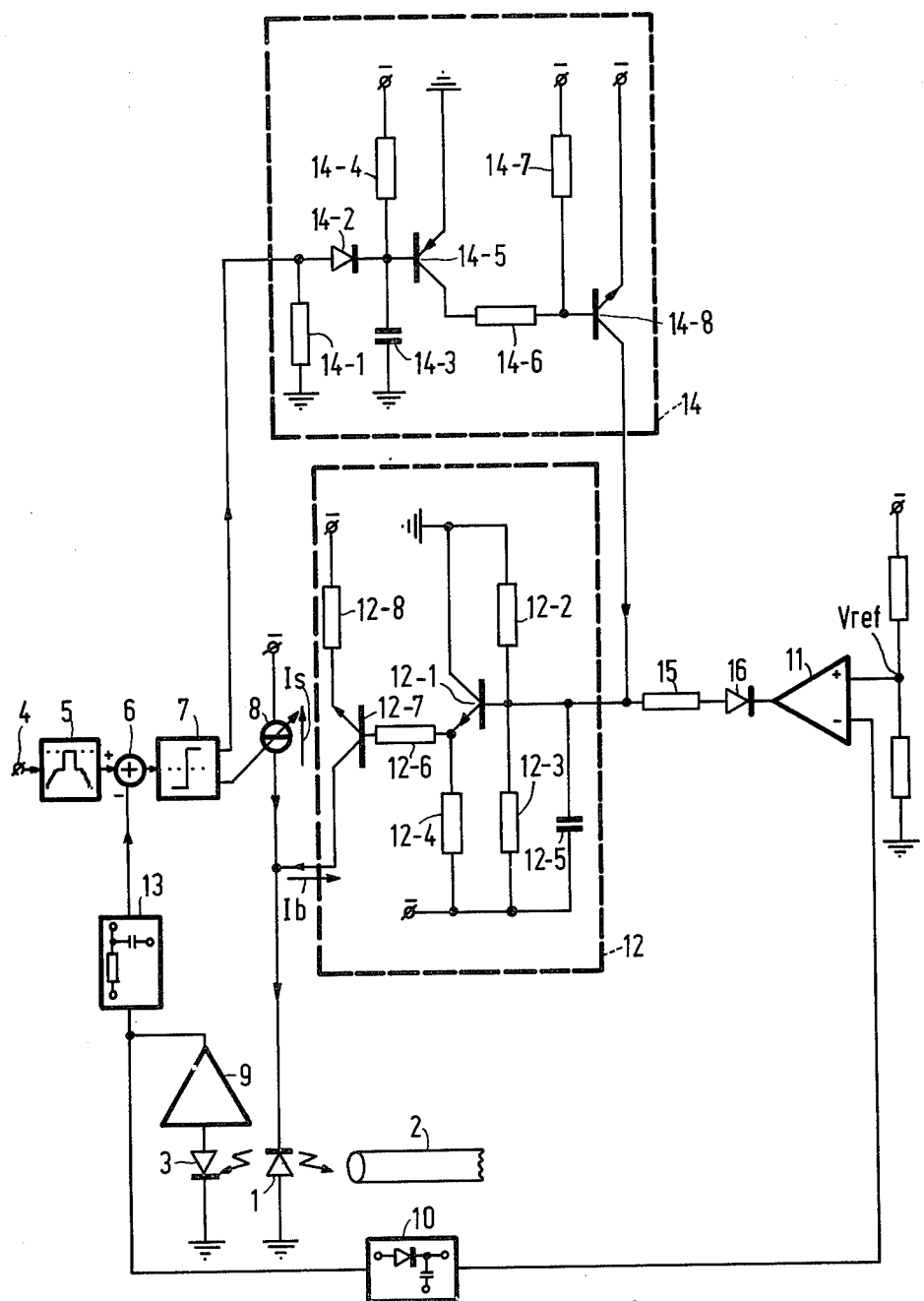
FIG. 3 shows an extension of the block schematic diagram of FIG. 1 comprising provisions to protect the laser diode.

In order to prevent the laser diode 1 from being overloaded a blocking device 14 is provided in the modulation arrangement of FIG. 3 to detect the disappearance of the self-excited oscillation of the negative feedback loop and to provide a blocking signal in the absence of the self-excited oscillation to block the bias current.

The blocking device 14 comprises a peak detector, including a resistor 14-1, a diode 14-2 and a capacitor 14-3, which is connected to the inverse output of the limiter 7. When this inverse output has a negative value for a predetermined period of time, then a negative voltage is produced across the capacitor 14-3 with respect to ground in response to the current through resistor 14-4. Then transistor 14-5 causes a current to flow through the resistor 14-6 and the resistor 14-7, as a result of which the transistor 14-8 starts to carry current. This current is derived from the input of the controllable current source 12, which input is connected to the output of amplifier 11 through a resistor 15 and a diode 16 which are arranged in series.

The controllable current source 12 comprises an input stage which includes a transistor 12-1 and the bias resistors 12-2 and 12-3 and an emitter load resistor 12-4. A capacitor 12-5, which can be discharged by the collector current of transistor 14-8 such that transistor 12-1 is cut-off, is arranged between the base of the transistor 12-1 and the negative supply voltage. When blocked, transistor 12-1 cannot pass a control current through the resistor 12-6 to the final stage which comprises the transistor 12-7 and the emitter load resistor 12-8. Then the collector of transistor 12-7 cannot apply a bias current Ib to the laser diode 1.

The diode 16 is blocked when transistor 14-8 starts carrying current, as a result of which the normal control of the bias current Ib by the output signal of amplifier 11 is interrupted. When, after a given period of time, the self-excited oscillation of the negative feedback loop starts, then the transistors 14-5 and 14-8 are cut-off and the normal control of the bias current Ib can beome operative.

The adjustable current source 8 can be implemented in the same manner as the adjustable current source 12, the details of which are shown in FIG. 3.

It should be noted that the invention is not limited to use in electro-optical converters. It can also be used in connection with, for example, electro-acoustic converters such as loudspeakers, it then being possible to reduce the influence of non-linearities on the acoustic output signal.

What is claimed is:

1. An arrangement for modulating the output signal of an electric signal converter comprising: an analog signal input terminal, a subtraction device having first and second inputs and an output, a signal limiter coupled to the output of the subtraction device for producing a pulse-shaped output signal for controlling the signal converter, a signal demodulator, means coupling the first input of the subtraction device to said input terminal, and means connecting the subtraction device, the limiter, the signal converter and the demodulator in a feedback loop wherein the demodulator demodulates a portion of the converter output signal to supply a feedback signal to the second input of the subtraction device whereby the feedback signal is subtracted from the analog input signal, an output signal of the subtraction device controlling the limiter which produces said pulse-shaped output signal for controlling the converter, whereby a self-excited oscillation is produced in the feedback loop with an analog signal dependent modulation of the pulse width and/or pulse density of the limiter output signal.

2. An arrangement as claimed in claim 1 wherein the demodulator comprises an integrator in the feedback loop.

3. An arrangement as claimed in claim 1 wherein the electric signal converter comprises an electro-optical converter including a semiconductor laser diode and means for applying a bias current to said laser diode, a detection circuit connected to the limiter for detecting the presence or absence of said self-excited oscillation and for producing a blocking signal in the absence of the self-excited oscillation, and means for blocking the semiconductor laser diode bias current in response to the blocking signal.

4. An arrangement as claimed in claim 1 wherein the demodulator comprises an integrator and the feedback loop comprises a wideband high gain negative feedback loop.

5. An arrangement for modulating the output signal of an electro-optical converter that converts an electric analog input signal into an optical output signal comprising: a subtraction device having a first input which receives an analog input signal, means coupling an output of said subtraction device to an input of a limiter which produces a binary output signal the value of which depends on the polarity of the input signal with respect to a discrimination level, an adjustable current source controlled by the limiter output signal and connected to said converter, a photo-detector for detecting a portion of an optical output signal of said converter, means for supplying said portion of the optical output signal to a second input of said subtraction device so that the signals present at said inputs are subtracted from one another, said subtraction device, limiter, converter and photo-detector being coupled together to form a feedback loop having a bandwidth and a gain such that said loop will be self-oscillating at a frequency outside the frequency band of the analog input signal.

6. An arrangement as claimed in claim 5 wherein the electro-optical converter comprises a semiconductor laser diode and means for applying a bias current thereto, and further comprising a detection circuit connected to the limiter for detecting the absence of the self-oscillating condition thereby to produce a blocking signal, and means responsive to the blocking signal for blocking the semiconductor laser diode bias current.

7. An arrangement as claimed in claim 5 wherein said optical output signal supplying means comprises an integrator circuit coupled between an output of the photodetector and the second input of the subtraction device.

8. An arrangement as claimed in claim 7 wherein the electro-optical converter comprises a semiconductor laser device, an adjustable bias current source coupled to the laser diode, a peak detector having an input coupled to an output of the photo-detector, a difference amplifier having a first input coupled to a source of reference voltage and a second input coupled to an output of the peak detector, and means coupling an output of the difference amplifier to a control input of the adjustable bias current source thereby to adjust the optical peak power to a level determined by said reference voltage.

9. An arrangement as claimed in claim 7 further comprising a signal clamp circuit for coupling the analog input signal to said first input of the subtraction device.

10. Apparatus for modulating the output signal of an electro-optical converter comprising: an analog electric signal input terminal, a signal combining device having first and second inputs and an output, means coupling a first input of the combining device to said signal input terminal, a signal limiter having an input coupled to the output of the combining device and an output at which appears a binary output signal for controlling said converter, an integrator device coupled between an output of the converter and the second input of the combining device, and means coupling the combining device, the limiter, the converter and the integrator in a wideband high gain negative feedback loop in which a self-excited oscillation is produced and wherein said analog signal modulates the pulse width and/or the pulse density of the limiter output signal.

11. An apparatus as claimed in claim 10 wherein the combining device comprises a subtraction device which subtracts the analog input signal and a feedback signal supplied by the integrator device in a manner so that the negative feedback loop compensates for any variations in an optical output signal of the converter by adjusting the pulse width/pulse period ratio of the limiter output signal as a function of the difference between the analog input signal and the feedback signal.

* * * * *